United States Patent [19]
Nakamura

[11] Patent Number: 5,986,502
[45] Date of Patent: Nov. 16, 1999

[54] MULTI-STAGE HIGH-PERFORMANCE AMPLIFIER

[75] Inventor: Katsufumi Nakamura, Cambridge, Mass.

[73] Assignee: Analog Devices, Inc., Norwood, Mass.

[21] Appl. No.: 09/193,476

[22] Filed: Nov. 17, 1998

Related U.S. Application Data

[63] Continuation of application No. 08/654,349, May 28, 1996, Pat. No. 5,838,199.

[51] Int. Cl.$^6$ .................................. H03F 3/45; H03F 3/04
[52] U.S. Cl. .......................... 330/258; 253/260; 253/311
[58] Field of Search .................................... 330/253, 258, 330/260, 292, 311

[56] References Cited

U.S. PATENT DOCUMENTS

| | | | |
|---|---|---|---|
| Re. 27,351 | 5/1972 | McGraw et al. | 330/258 |
| 3,182,269 | 5/1965 | Smith . | |
| 3,370,245 | 2/1968 | Royce et al. | 330/258 |
| 3,491,307 | 1/1970 | Solomon et al. | 330/260 |
| 3,786,362 | 1/1974 | Marsh et al. | 330/258 |
| 4,172,238 | 10/1979 | Kusakabe | 330/253 |
| 4,808,944 | 2/1989 | Taylor | 330/253 |
| 4,885,548 | 12/1989 | Wakimoto et al. | 330/292 |
| 5,084,639 | 1/1992 | Ribner | 330/9 |
| 5,182,477 | 1/1993 | Yamasaki et al. | 330/260 |
| 5,337,010 | 8/1994 | Nishiyama | 330/311 |
| 5,485,121 | 1/1996 | Huijsing et al. | 330/260 |

FOREIGN PATENT DOCUMENTS

| | | | |
|---|---|---|---|
| 0 320 471A2 | 6/1989 | European Pat. Off. | H03F 3/45 |
| 0 641 069A1 | 3/1995 | European Pat. Off. | H03F 3/45 |
| 42 10 215A1 | 12/1992 | Germany | H03F 3/45 |
| 42 43 0091A1 | 6/1994 | Germany | H03F 3/181 |

OTHER PUBLICATIONS

V.I. Anisimov et al., "Comparative Response of the Input Stages of Differential Operational Amplifiers", Automation and Remote Control, vol. 36, No. 6 II, Jun. 1975, pp. 1015–1023.

Alan B. Grebene, "Bipolar and MOS Analog Integrated Circuit Design", 1984, pp. 415–449.

Kazuyuki Matsui et al., "CMOS Video Filters Using Switched Capacitor 14–MHz Circuits", IEEE Journal of Solid–State Circuits, vol. sc–20, No. 6, Dec. 1985, pp. 1096–1102.

Stephen H. Lewis et al., "A Pipelined 9–State Video–Rate Analog–to–Digital Converter", IEEE 1991 Custom Integrated Circuits Conference, 1991, pp. 26.4.1–26.4.4.

Bang–Sup Song et al., "A 12–Bit 1–MSample/s Capacitor Error–Averaging Pipelined A/D Converter", IEEE Journal of Solid–State Circuits, vol. 23, No. 6, Dec. 1988, pp. 1324–1333.

Seung–Hoon et al., "Digital–Domain Calibration of Multistep Analog–to–Digital Converters", IEEE Journal of Solid–State Circuits, vol. 27, No. 12, Dec. 1992, pp. 1679–1688.

Bang–Sup Song et al., "A 10–b 15–MHz CMOS Recycling Two–Step A/D Converter", IEEE Journal of Solid–State Circuits, vol. 25, No. 6, Dec. 1990, pp. 1328–1337.

*Primary Examiner*—Robert Pascal
*Assistant Examiner*—Patricia T. Nguyen
*Attorney, Agent, or Firm*—Wolf, Greenfield & Sacks, P.C.

[57] ABSTRACT

A two-stage switched-capacitor CMOS Miller-compensated amplifier uses only n-channel transistors in its signal path to reduce the deleterious effects of parasitic capacitances in the signal path while still obtaining a high transconductance in both stages. A transistor inserted in series with the Miller capacitor between the output and input of the second stage of the amplifier introduces a feedforward zero in the left half of the S-plane of the circuit. By appropriately sizing the aspect ratio and properly biasing this transistor, the second pole of the amplifier is canceled with the introduced zero. Dummy transistors having their sources and drains connected (to serve as capacitors) are cross-connected between opposite polarity inputs and outputs of a differential pair of input transistors in the first stage to effectively cancel the gate-to-drain Miller-multiplied capacitance of the input transistors. A common-mode control current is generated based upon a voltage at a common-source node of a differential pair of input transistors in the second stage. This current is fed back to the first stage to control the common-mode of the first stage.

20 Claims, 7 Drawing Sheets

MULTI-STAGE HIGH-PERFORMANCE AMPLIFIER

This is a continuation of application Ser No. 08/654,349, filed May 28, 1996, Pat. No. 5,838,199.

FIELD OF THE INVENTION

The present invention relates generally to electronic amplifier circuits and, more particularly, to a multi-stage amplifier circuit that has relatively high bandwidth and open-loop and closed-loop gains. The invention is particularly well suited for use as a residue amplifier in a multi-stage pipelined analog-to-digital converter (pipelined ADC).

BACKGROUND OF THE INVENTION

A pipelined ADC is shown generally at 20 in FIG. 1. A pipelined ADC typically includes an input sample and hold amplifier circuit (SHA) 22 and several pipeline stages 23, 25 and 27. Each pipeline stage generally comprises a flash analog-to-digital converter (flash ADC) such as 30, 32, 34 and 36 and a corresponding residue amplifier 24, 26 and 28. Each residue amplifier 24, 26 and 28, in turn, includes at least one amplifier stage, a digital-to-analog converter (DAC), as well as a SHA. The interrelationship among these components is explained below.

The SHA 22 samples a signal at the input of the pipelined ADC 20, VIN, and holds this signal at its output long enough to allow a first stage 23 of the pipeline to operate on it. This first stage 23 includes a first-stage flash ADC 30 and a first-stage residue amplifier 24. The first-stage flash ADC 30 quantizes the sampled signal and provides an n-bit digital word. This word represents the amplitude of the sampled signal (relative to the flash ADC reference voltage), accurate to n-bits. The first-stage DAC (within residue amplifier 24) then accepts the n-bit word from the first-stage flash ADC 30 and converts the word back into analog format. The first-stage residue amplifier 24 measures the amplitude difference between the sampled signal and the n-bit approximation of the sample as supplied by the first-stage DAC (within residue amplifier 24). This difference is termed the first-stage "residue," as it represents the portion of the signal beyond the resolution of the first n-bit conversion. The first-stage residue amplifier 24 then amplifies the first-stage residue by a factor of $2^n$, and holds the amplified first-stage residue while it is processed in the second stage 25 of the pipeline.

In the second pipeline stage 25, a second-stage flash ADC 32 quantizes the amplified first-stage residue into an m-bit digital word, i.e., a word accurate to m-bits. A second-stage DAC (within residue amplifier 26) converts the m-bit digital word back into analog format, and the second-stage residue amplifier 26 measures the difference between the actual amplified residue from the first-stage residue amplifier 24 and the analog output of the second-stage DAC (within residue amplifier 26). This difference represents the residue from the second-stage flash ADC 32 and is further amplified by a factor of $2^m$ to provide an amplified second-stage residue. This amplified second-stage residue then is held by the second-stage residue amplifier 26 while it is processed in the following stage of the pipeline. This process may be continued with additional pipeline stages as required to achieve the desired resolution. A digital adder 38 combines the outputs of flash ADCs 30, 32, 34 and 36 and provides a digital output to output bus 40.

Thus, after the first two pipeline stages, an (m+n) bit digital word (accurate to (m+n) bits) is obtained. In other words, the first stage provides a rough measurement of the sampled signal (accurate to a finite number of bits), and each successive stage fine-tunes that measurement. In many practical implementations, an amplification factor of less than $2^n$ in the first stage and less than $2^m$ in the second stage is implemented so that some form of digital correction can be used to correct errors in the flash ADCs. For example, many pipeline converters manufactured today are implemented with residue amplification factors of $2^{n-1}$ and $2^{m-1}$ respectively in the first and second stage residue amplifiers, and provide an m+n−1 bit digital word accurate to m+n−1 bits after the first two pipeline stages.

It is apparent from the foregoing that the proper design of the residue amplifiers 24, 26 and 28 is of particular relevance in maximizing the speed and accuracy of a pipelined ADC. Traditionally, pipelined ADCs have employed high-speed switched-capacitor circuits as residue amplifiers. Such switched-capacitor circuits normally use single-stage amplifier structures to achieve fast settling times. To attain high gain with these devices, cascode transistors commonly are used in their Outputs to increase the output impedance of the amplifiers, thereby increasing their gain. An example of a prior art single-stage cascode circuit, commonly referred to as a "telescopic" cascode amplifier, is shown at 41 in FIG. 2. In this example, the circuit of amplifier 41 is cascoded twice (with cascode transistors M4–M7) to achieve twice the cascode gain in the one stage than a single cascode transistor would provide. The open-loop bandwidth of such a single-stage device (OLBW$_{(SINGLE-STAGE)}$) is defined by the transconductance (gm) of the single-stage amplifier divided by the capacitance loading the output ($C_L$), i.e., OLBW$_{(SINGLE-STAGE)}$=gm/$C_L$. Such a single-stage amplifier circuit also has a non-dominant parasitic pole at a frequency dictated by the parasitic capacitances of the MOS transistors in the signal path of the amplifier. Since the frequency location of this parasitic pole can be optimized to be as large as one giga-hertz (GHz). the closed-loop bandwidth of a single-stage amplifier may be increased to nearly this value before the phase margin of the circuit degrades (due to the non-dominant pole) and causes the circuit to become unstable. Thus, by utilizing proper gain enhancement techniques (e.g., telescopic cascodes), a single-stage amplifier circuit can be made to settle quickly.

There, however, are several drawbacks associated with single-stage telescopic cascodes. First, telescopic cascode amplifiers are not well suited for use with large capacitive loads. Because the open-loop bandwidth of a single-stage amplifier (OLBW$_{(SINGLE-STAGE)}$) is determined by dividing the input transconductance (gm) by the output load capacitance ($C_L$), i.e., OLBW$_{(SINGLE-STAGE)}$=gm/$C_L$, to maintain a high bandwidth in a circuit with a large capacitive load, a large gm is required to counteract the large capacitance value of $C_L$. One way to increase the transconductance of an amplifier is to use larger transistors in the amplifier's signal path. Normally, a single-stage amplifier will have a feedback capacitance ($C_F$) connected between its output and its input, and will have an input capacitance ($C_{IN}$) connected to its input to be charged by an input signal. There also may be a parasitic capacitance ($C_P$) (from the intrinsic properties of the MOS input transistors) at the input of the amplifier. The feedback attenuation (ATTEN$_{FB}$) of such a circuit is determined by the following equation: ATTEN$_{FB}$=$C_F$/($C_F$+$C_{IN}$+$C_P$). Therefore, the closed-loop bandwidth of the single-stage circuit (CLBW$_{(SINGLE-STAGE)}$) is determined by multiplying the open-loop bandwidth (OLBW$_{(SINGLE-STAGE)}$) by the feedback attenuation (ATTEN$_{FB}$), i.e.

$CLBW_{(SINGLE-STAGE)} = OLBW_{(SINGLE-STAGE)} *$ $ATTEN_{FB} = (gm/C_L) * C_F/(C_F+C_{IN}+C_P)$, where * indicates multiplication.

The transconductance may be raised (to counteract a large capacitance value of $C_L$) by increasing the transistor sizes, but a large increase in the transistor sizes will result in a substantial increase in the parasitic capacitance ($C_P$) at the input. This increase in the parasitic capacitance may, in turn, substantially decrease the closed-loop bandwidth of the amplifier circuit through feedback attenuation. Thus, an upper limit is placed on the amount the transconductance may be increased (by increasing the transistor size) without having the increased parasitic capacitance limit the bandwidth.

Another way to increase the input transconductance (gm) of a single-stage amplifier is to use mirror gain. This is accomplished by mirroring the current provided at the output of the input transistors (i.e., the input current multiplied by the value of gm) to the cascode output structure. By doing this, the effective transconductance of the amplifier is made equal to the transistor transconductance (gm) multiplied by the current gain of the current mirror. The drawback to using mirror gain, however, is that the current mirror adds parasitic capacitance in the signal path. Also, such a mirrored circuit has a unique noise disadvantage caused by using an inherently smaller gm in conjunction with an intentionally increased bandwidth.

The second problem with a telescopic cascode amplifier is that it imposes a severe headroom constraint on the output signal swing capability. Since each cascode transistor must have a drain-to-source voltage ($V_{DS}$) of at least its gate-to-source voltage ($V_{GS}$) minus its threshold voltage ($V_T$), i.e., $V_{DS} > V_{GS} - V_T$, multiple cascode devices arranged in series (when biased correctly) require a significant voltage drop across them, thereby substantially reducing the voltage swing headroom available at the output of the amplifier. This especially becomes a problem when the amplifier is operating from limited voltage rails (e.g.. three volts).

An alternative to using a single-stage amplifier is to use a two-stage amplifier with Miller compensation, i.e., a Miller capacitance ($C_C$) coupled between the second-stage output and the second-stage input. By using such a structure, the overall gain requirement may be spread over the two-stages so that minimum channel length transistors may be used in each stage. Additionally, because all of the gain need not be achieved in a single stage (requiring multiple cascode transistors), the use of two stages alleviates the lack of output signal swing headroom that was encountered with the use of a single-stage amplifier circuit.

The bandwidth of a Miller-compensated two-stage amplifier ($BW_{(TWO-STAGE)}$) is determined by dividing the transconductance of the first stage (gm1) by the Miller capacitance ($C_C$), i.e., $BW_{(TWO-STAGE)} = gm1/C_C$. Thus, the bandwidth can be somewhat controlled by appropriately selecting the value of the Miller capacitance ($C_C$). A two-stage structure also has a non-dominant pole (P2) at a frequency location determined by the following equation: $P2 \cong (gm2/C_L) * C_C/(C_C+C_{P2})$, where gm2 is the transconductance of the second state and $C_{P2}$ is the parasitic capacitance at the input of the second stage. Additionally, a two-stage amplifier has a third non-dominant pole (P3) with a location dictated by the parasitic capacitances of the MOS transistors in the signal path of the amplifier. The location of this parasitic pole may be optimized to be at a very large frequency, i.e., approximately one GHz. As the signal frequency approaches the frequency of the first non-dominant pole (P2), however, the phase margin will degrade rapidly and the circuit will become unstable. Thus, although the bandwidth of the two-stage circuit may be increased (by increasing gm1 or by decreasing $C_C$), the presence of pole P2 severely restricts the extension of the bandwidth beyond the location of pole P2.

FIG. 3 shows a prior art two-stage amplifier circuit 42 with a p-channel differential pair of transistors M1 and M2 as an input stage and an n-channel (single-ended) output-stage transistor M3. It is known that n-channel MOS transistors provide significantly more transconductance in relation to their size than do p-channel transistors. Typically, an n-channel device will provide a transconductance value that is approximately a factor of three greater than that of an equivalently sized p-channel device. The parasitic capacitances of p-channel and n-channel transistors, however, are nearly equal for equivalently sized devices. In view of the equation stated above regarding the location of pole P2, it is advantageous, then, to have an n-channel second stage (so as to optimize the location of pole P2).

Since each of the amplifying transistors must be biased so that its drain-to-source voltage ($V_{DS}$) is greater than its gate-to-source voltage ($V_{GS}$) minus a transistor threshold voltage ($V_T$), i.e., $V_{DS} > V_{GS} - V_T$, it also makes sense that the input and output stages be transistors of opposite doping types, i.e., n-channel and p-channel. That is, given a limited supply voltage, it is much easier to bias the two stages of transistors when the input and output stages use oppositely doped transistors. This is especially true when the supply rails carry only about three volts.

In addition, the (larger) p-channel transistors are preferred in the first stage of a two-stage amplifier for a variety of reasons, including: (1) providing better matching between the transistors comprising a differential pair of input transistors, thereby reducing offset errors caused by mismatches between the pair, and (2) having lower "flicker noise," i.e., low frequency noise caused by trapped defects in the oxide layers or the substrates of the devices. Thus, the prior art teaches that in a limited headroom environment, although p-channel transistors have a larger parasitic capacitance (for an equivalent gain) than do n-channel transistors, it is a better design choice to use p-channel transistors in the first stage of a two-stage Miller-compensated amplifier.

Therefore, a need exists for an amplifier circuit suitable for use switched capacitor circuits that operate at very high frequencies.

SUMMARY OF THE INVENTION

The features and advantages of the present invention will be more readily understood and apparent from the following detailed description of the invention, which should be read in conjunction with the accompanying drawings, and from the claims which are appended to the end of the detailed description.

An amplifier circuit is disclosed having a feedforward signal path comprising transistors of a common doping type through all stages of the amplifier circuit. According to one embodiment of the invention, the amplifier includes first and second amplifier stages with the output of the first amplifier stage being coupled to the input of the second amplifier stage, and each amplifier stage has a feedforward signal path only including transistors of the common doping type.

According to another embodiment, the first and/or second amplifier stages include differential pairs of input transistors. According to a further embodiment, a pair of capacitances are coupled between the inputs and outputs of a differential pair of input transistors in the first amplifier stage; each capacitance being coupled between one polarity input and another polarity output, with at least one capacitance being coupled to each polarity input.

According to yet another embodiment of the invention, a resistance is placed in series with a Miller capacitance, which series combination is coupled around the second stage. The resistance is selected so as to provide a feedforward zero in a transfer function of the circuit that substantially cancels the second pole of the circuit (determined by (approximately) gm2/$C_L$). And according to another embodiment, first and second differential amplifier stages are coupled together in series. A device configured to generate a common-mode control current is coupled to a common node of a differential pair of input transistors in the second amplifier stage. This device is connected to feed the common-mode control current back to the first amplifier stage, which current controls the common-mode level of the first amplifier stage.

DETAILED DESCRIPTION OF THE INVENTION

Figure 1:
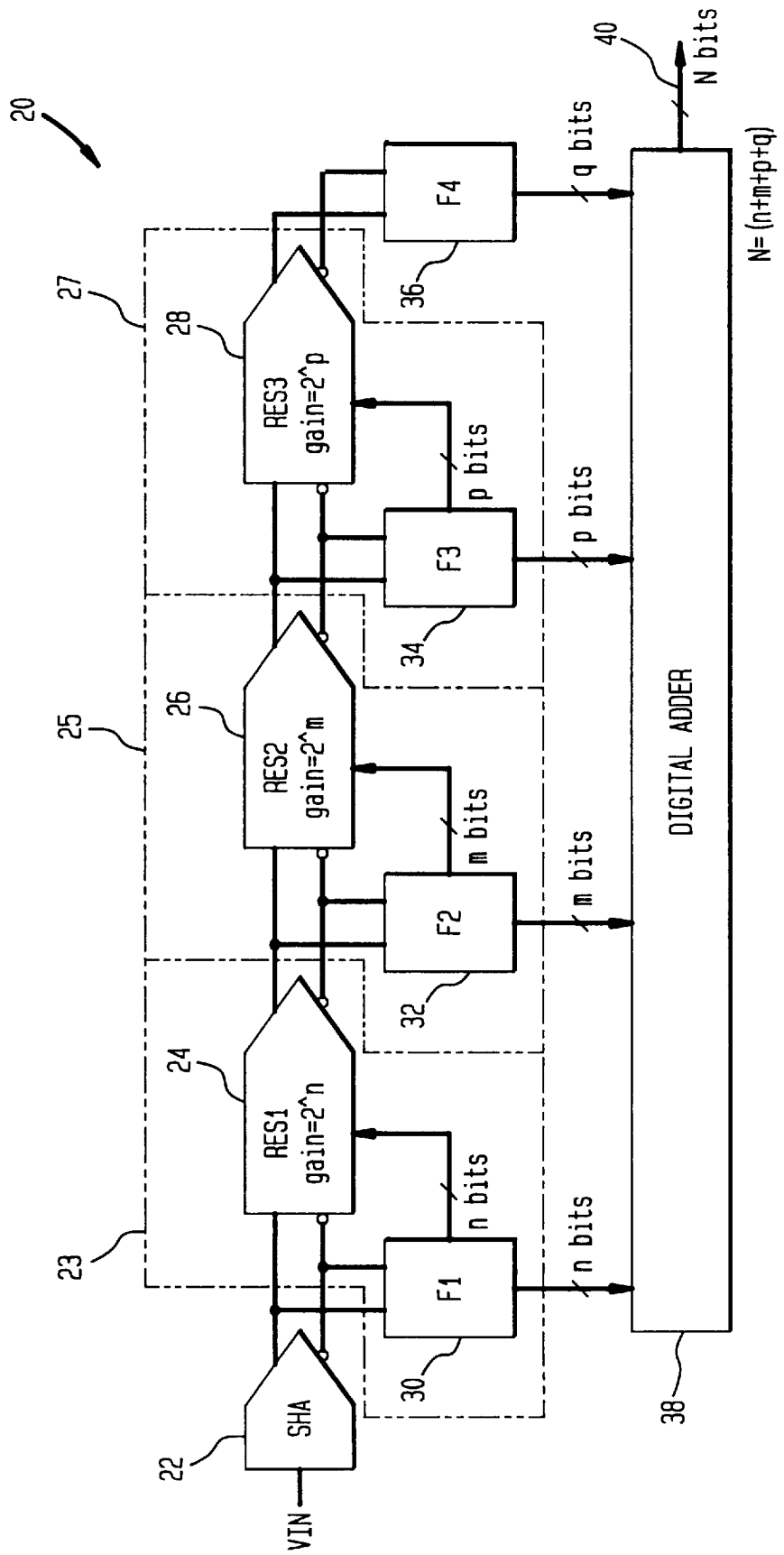
FIG. 1 is a block diagram showing a typical architecture of a multi-stage pipelined ADC, for which the instant invention is particularly well suited.
Figure 2:
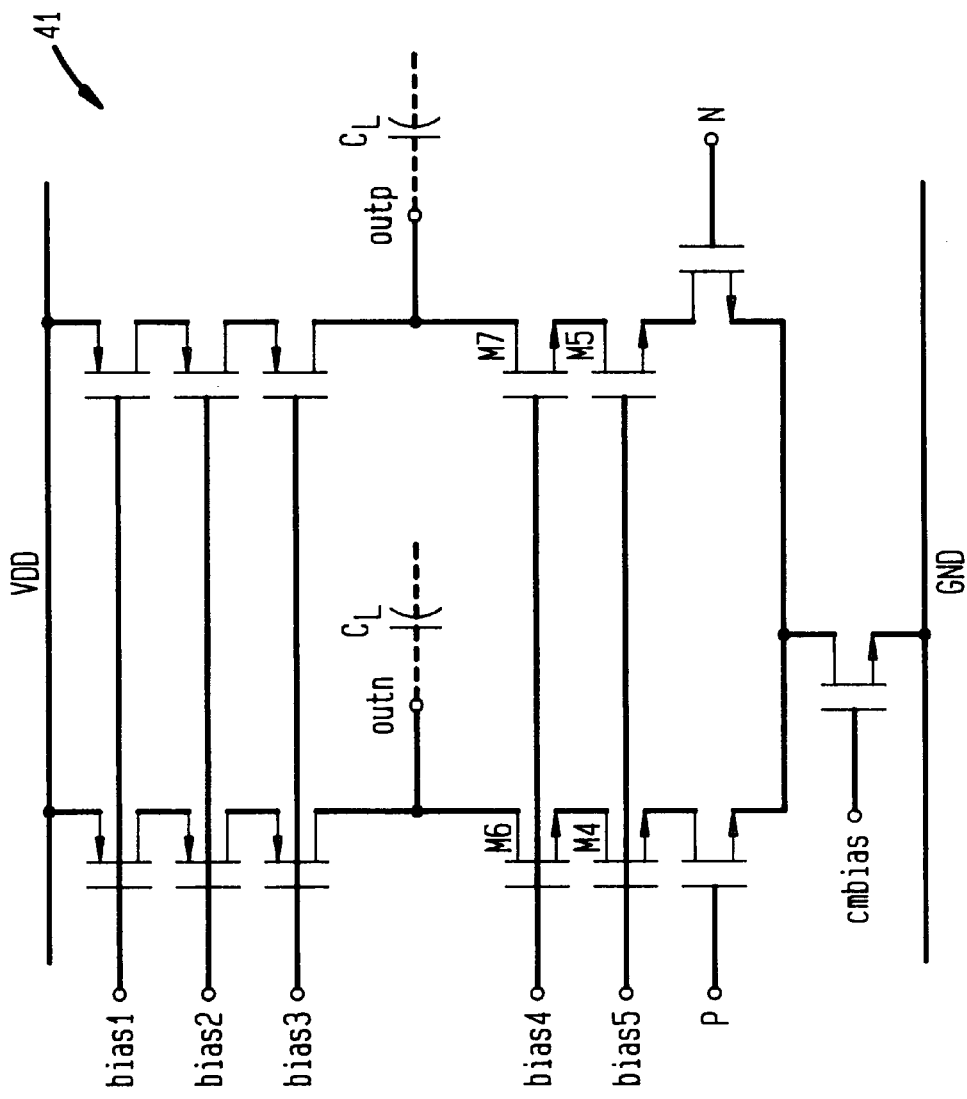
FIG. 2 is a schematic diagram of a prior art single-stage amplifier having telescopic cascodes in its output.
Figure 3:
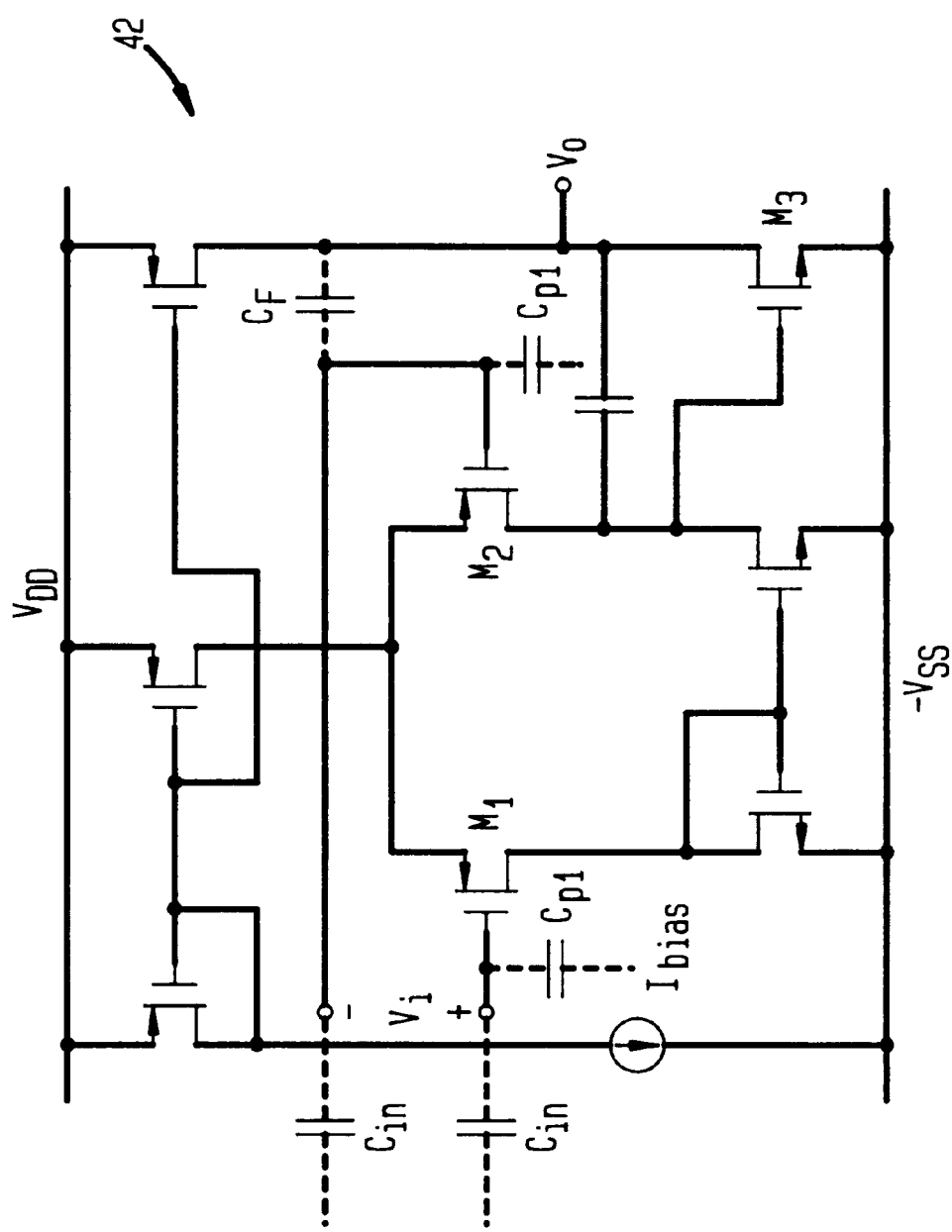
FIG. 3 is a schematic diagram of a prior art two-stage Miller-compensated amplifier having a p-channel first stage and an n-channel second stage.

A two-stage Miller-compensated amplifier (such as that shown at 42 in FIG. 3) typically will have a feedback capacitance ($C_F$) coupled between the output of the second stage and the input of the first stage, and an input capacitance ($C_{IN}$) connected to the input of the first stage to be charged by an input signal. Such a circuit also will have a parasitic capacitance ($C_{P1}$) present at the input of the first stage, which is caused by inherent characteristics of the input MOS devices. The presence of these capacitances results in a feedback attenuation ($ATTEN_{FB}$) determined by the following equation: $ATTEN_{FB}=C_F/(C_F+C_{IN}+C_{P1})$ The closed-loop bandwidth of a two-stage Miller-compensated amplifier ($CLBW_{(TWO-STAGE)}$) is equal to the open-loop bandwidth of the amplifier ($OLBW_{(TWO-STAGE)}$=gm1/$C_L$) multiplied by the feedback attenuation ($ATTEN_{FB}=C_F/(C_F+C_{IN}+C_{P1})$), i.e., $CLBW_{(TWO-STAGE)}$=(gm1/$C_L$) * $C_F/(C_F+C_{IN}+C_{P1})$. In light of this relationship. It has been discovered to be advantageous to utilize only n-channel transistors in the feedforward signal path of the input stage, as well as in the feedforward signal path of the output stage. As used herein, the feedforward signal path refers to the path coupled between the input and output of the two-stage amplifier through which the input signal is processed (e.g., amplified).

By using only n-channel transistors in the feedforward signal path of the input stage (rather than using p-channel transistors instead of or in addition to n-channel transistors), the value of $CLBW_{(TWO-STAGE)}$ will be maximized because n-channel transistors have a larger value of transconductance for a given transistor size than do p-channel transistors. Further, for the same amount of transconductance in the first stage (gm1), n-channel transistors in the feedforward signal path of the first stage will introduce approximately one third the capacitance value of $C_{P1}$ than will p-channel transistors.

Figure 4:
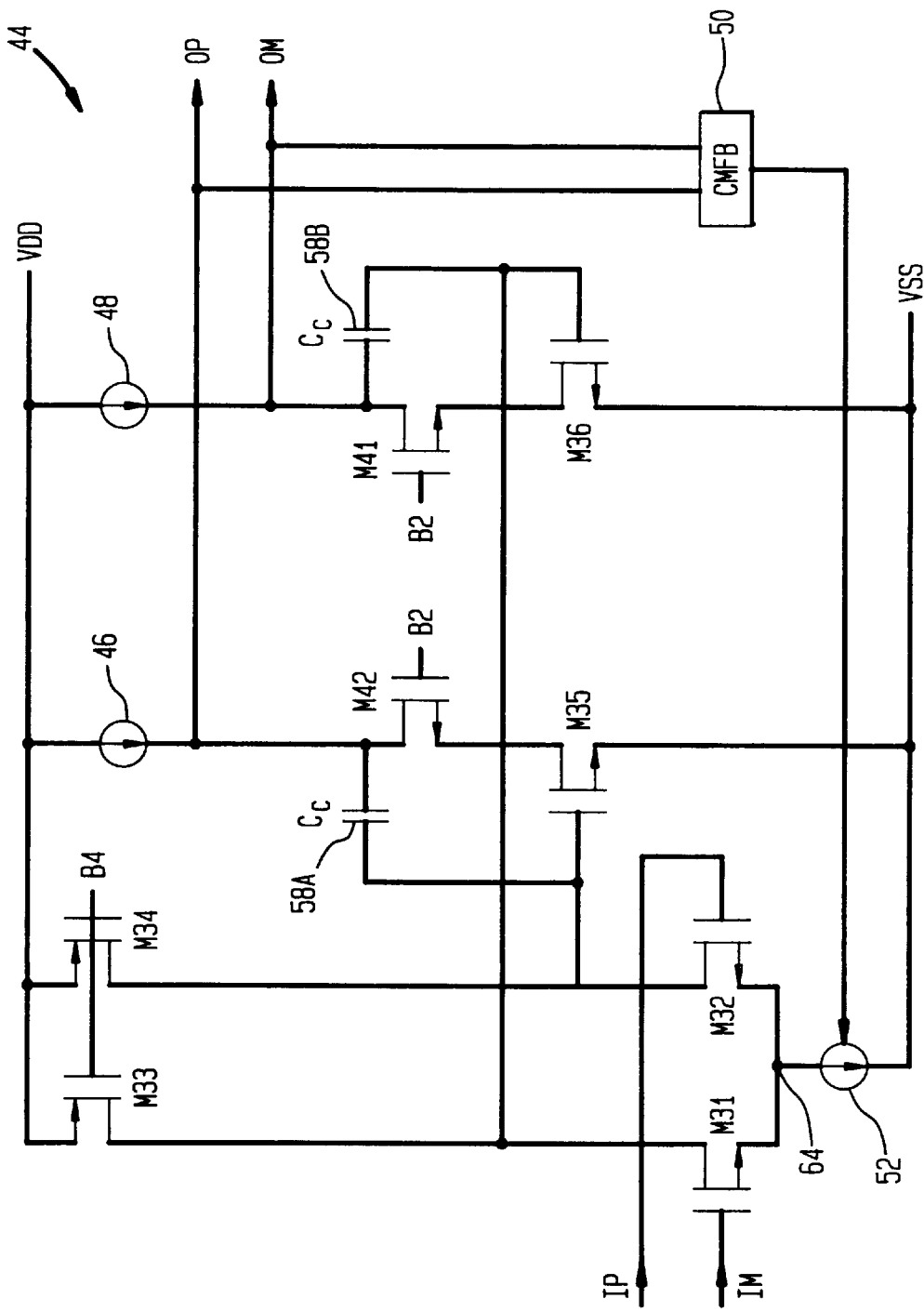
FIG. 4 is a schematic diagram of one embodiment of the present invention.

An example of a two-stage, fully-differential, Miller-compensated amplifier that utilizes n-channel transistors in the feedforward signal paths of the first and second stages is shown at 44 in FIG. 4. Referring now to FIG. 4, a differential pair of input transistors of a common (n-channel) doping type. M31 and M32, receive a differential input signal at their gates, i.e., the control electrodes of MOS transistors, from opposite polarity input nodes IM and IP, respectively. The source nodes (i.e., one of two current electrodes of an MOS transistor, the other being the drain node) of transistors M31 and M32 are connected at a common node 64. Common node 64 is driven by current source 52, which is controlled by common-mode feedback (CMFB) network 50. Common-mode feedback network 50 responds to inputs from output nodes OP and OM of the second stage. Transistors M31 and M32 are biased by (p-channel) transistors M33 and M34, respectively, which serve as current sources. Both of transistors M33 and 34 are biased at their gates by a voltage present at bias node B4. To power the circuit, a voltage is placed across power supply nodes VDD and VSS, with VDD being the high power supply node and VSS being the low power supply node. Preferredly, the power supply voltage is about three volts.

The drain nodes, i.e., outputs, of transistors M31 and M32 are connected to the inputs of the second stage, i.e., the gates of (n-channel) transistors M36 and M35, respectively. The source nodes of transistors M36 and M35 both are connected to low power supply node VSS. Further, (n-channel) cascode transistors M41 and M42, respectively, are used in the output of the second stage so as to increase its output impedance and thereby increase the gain of the second stage. Specifically, cascode transistors M41 and M42 have their source nodes connected to the drain nodes of transistors M36 and M35, respectively, and are both biased at their gates from a voltage present at bias node B2. Input transistor/cascode pair M35/M42 is biased by current source 46, which is connected to the drain of transistor M42. Similarly, input transistor/cascode pair M36/M41 is biased by current source 48, which is connected to the drain of transistor M41. Additionally, Miller capacitors 58A and 58B are connected, respectively: (1) between output node OP and the gate of second-stage input transistor M35, and (2) between output node OM and the gate of second-stage input transistor M36.

While the design of circuit 44 in FIG. 4 reduces the parasitic capacitance at the input of the first stage (by using n-channel rather than p-channel transistors), thus providing at least one distinct advantage over prior art circuits, there are a few drawbacks to using this implementation. First, because the source nodes of transistors M35 and M36 are connected directly to low power supply node VSS, the voltages at the drain nodes of transistors M32 and M31 are clamped to the gate-to-source voltages ($V_{GS}$) of transistors M35 and M36, respectively. This voltage clamping makes it very difficult to bias transistors M31 and M39 properly, as each transistor must be biased so as to satisfy the equation:

$V_{GS} > V_{DS} - V_T$. Secondly, any power supply noise present at low power supply node VSS may infiltrate the signal path through the source nodes of transistors M35 and M36. This noise may be significant, resulting in a poor negative power-supply-rejection-ratio (PSRR) at high frequencies and an unsatisfactory signal-to-noise ratio at the output of the amplifier. Finally, since the common-mode feedback current (from common-mode feedback network 50) is fed from the output of the second stage to the first stage, it is compensated by Miller capacitors 58A and 58B. This Miller compensation makes the overall common-mode response slow.

Figure 5:
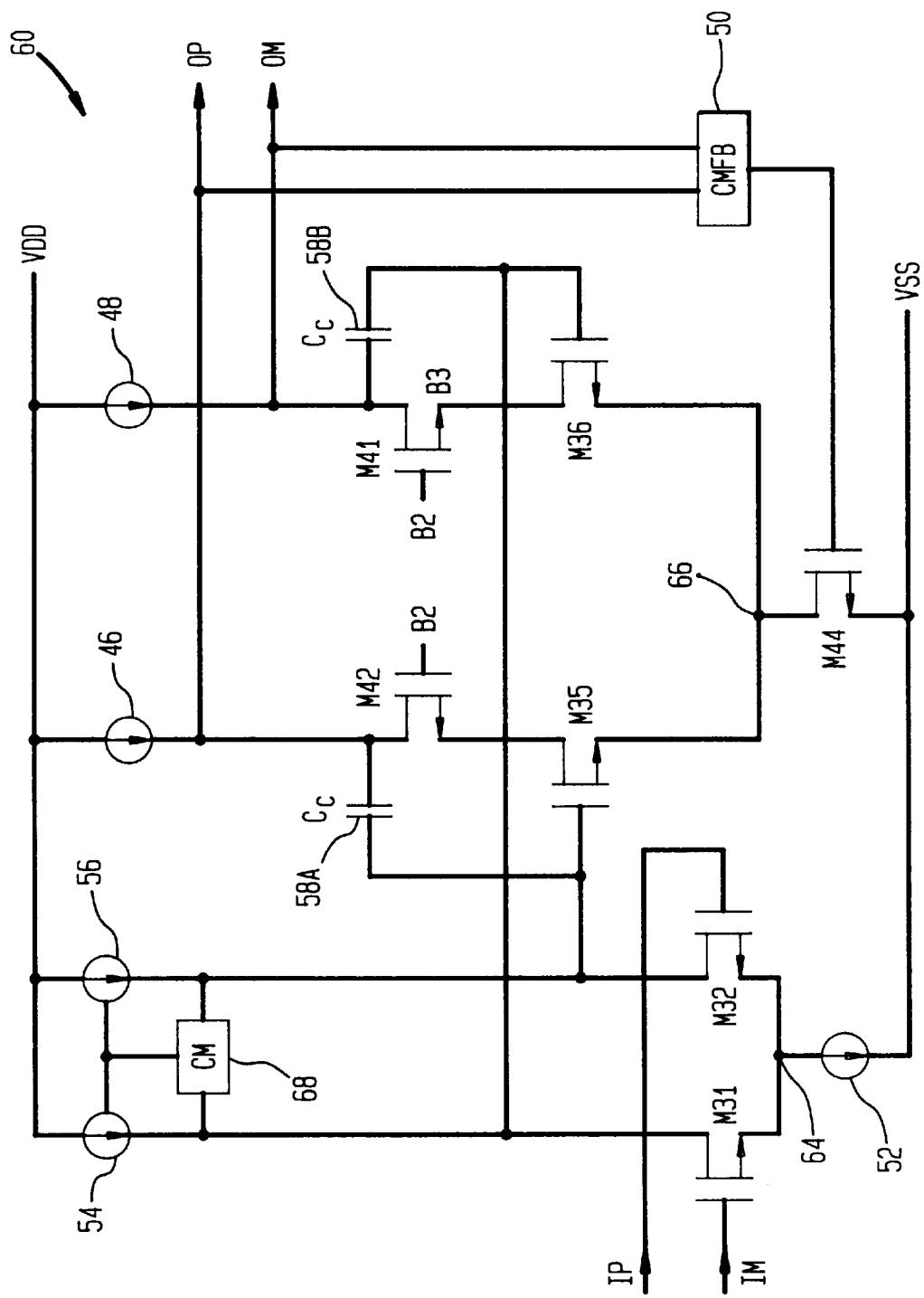
FIG. 5 is a schematic diagram of another embodiment of the present invention that incorporates modifications to the circuit shown in FIG. 4.

Circuit 60 (shown in FIG. 5) incorporates several modifications to circuit 44 (shown in FIG. 4). Although embodiment 44 of the invention provides distinct advantages over prior art circuits, the modifications incorporated in circuit 60 help to alleviate the above identified drawbacks of that particular embodiment. Referring now to FIG. 5, second-stage input transistors M35 and M36 are source-connected at a common node 66. A tail current source (n-channel transistor M44) is connected between common node 66 and low power supply node VSS. The addition of tail current source M44 provides several advantages. First, the voltage at common node 66 now will be at a voltage determined by the drain-to-source voltage drop ($V_{DS}$) across transistor M44, thus providing additional voltage headroom with which to bias first-stage input transistors M31 and M32. That is, the voltages at the drains of transistors M31 and M32 (in relation to a voltage at node VSS) now will be determined by summing $V_{DS}$ of transistor M44 with $V_{GS}$ of transistors M36 and M35, respectively. This additional headroom makes the proper biasing of input transistors M31 and M32 much easier to achieve.

Further, the addition of tail current source M44 in the second stage improves the negative PSRR of the circuit. This improvement is a result of current source M44 being positioned between common-source node 66 and low power supply node VSS. In this manner, noise on node VSS is hindered from entering the signal path through the source nodes of second-stage input transistors M35 and M36.

Additionally, the use of fully differential first and second stages allows the common-mode level of each stage to be independently (and locally) controlled. That is, common-mode feedback network 50 can sense the common-mode level of the output of the second stage and control the common-mode level of the second stage via transistor M44, and first-stage (local) common-mode feedback network 68 can sense the common-mode component of the output of the first stage and control the common-mode level of the first stage via current sources 54 and 56. This local common-mode control of each stage provides at least two advantages: (1) it provides two common-mode feedback circuits with relatively short signal paths, rather than one long feedback path traversing both amplifier stages, and (2) it avoids the effect of Miller compensation on the common-mode feedback signal. Both of these effects result in a faster common-mode response for the two-stage circuit.

Figure 6:
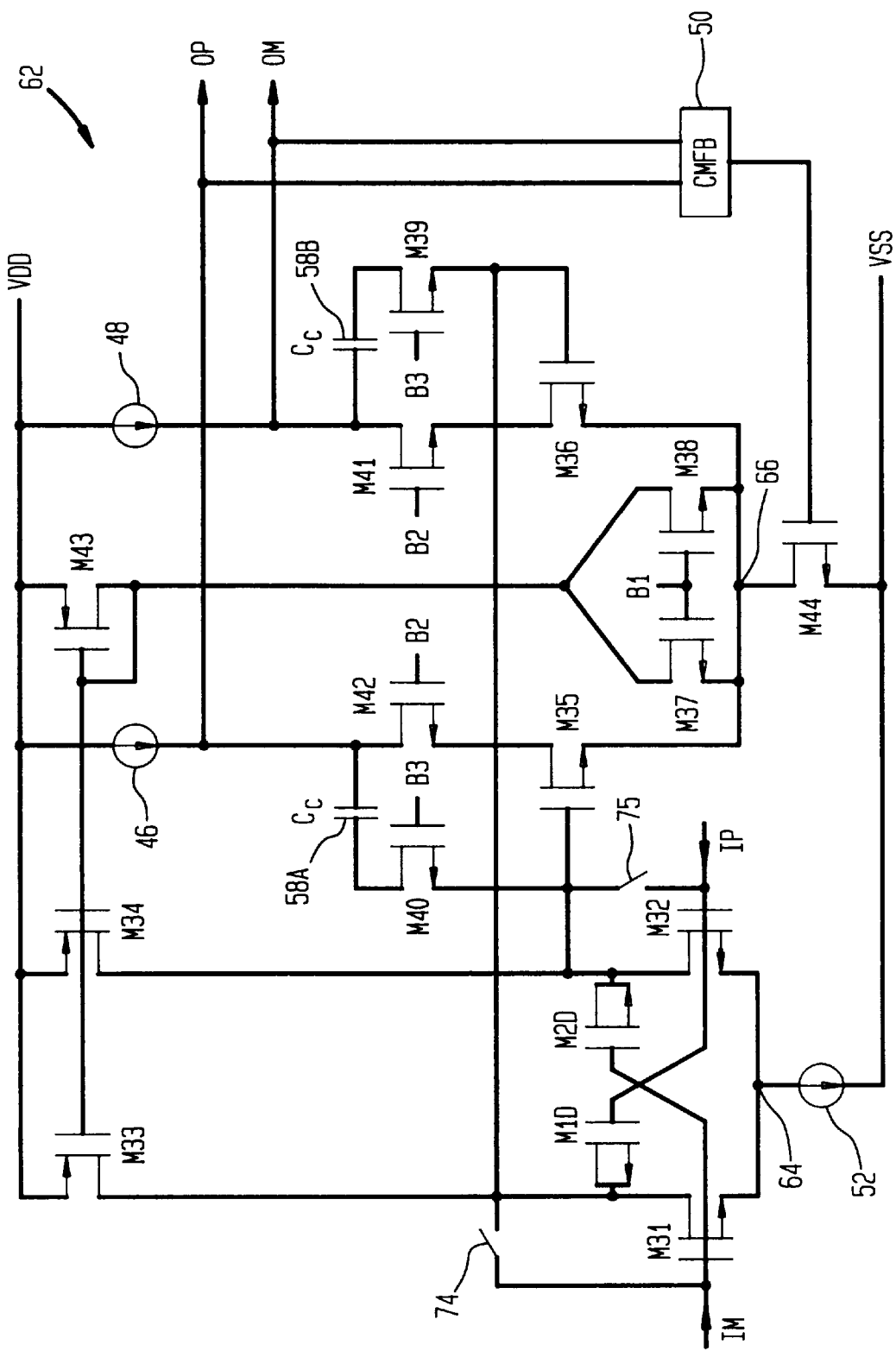
FIG. 6 is a schematic diagram of yet another embodiment of the present invention that incorporates even further modifications to the circuits depicted in FIGS. 4 and 5.

Circuit 62 (shown in FIG. 6) incorporates further modifications to circuit 60 (shown in FIG. 5). Referring to FIG. 6, (n-channel) dummy transistors M1D and M2D are cross-connected across the input and output of the first stage amplifier. The reason for adding these transistors is as follows. As stated earlier, the closed-loop bandwidth of a two-stage Miller-compensated amplifier having an input capacitance ($C_{IN}$) connected to the input of the first stage and a feedback capacitance ($C_F$) connected between the output of the second stage and the input of the first stage is determined by the following equation: $CLBW_{(TWO-STAGE)} =$ $(gm1/C_L) * C_F/(C_F + C_{IN} + C_{P1})$. $C_{P1}$ in this equation represents the parasitic capacitance at the input of the first stage.

An MOS transistor has at least two sources of parasitic input capacitance: (1) the gate-to-drain capacitance ($C_{GD}$), which is (approximately) proportional to the width of the transistor channel, and (2) the gate-to-source capacitance ($C_{GS}$), which is (approximately) proportional to the area of the transistor channel, i.e., channel length * channel width. Thus, $C_{GS}$ commonly is the dominant factor in determining the total input parasitic capacitance ($C_{P1}$). Since $C_{GD}$ is effectively coupled between the output of the first stage and the input of the first stage, however, its value is Miller-multiplied by gm1 and further multiplied by the resistance value of $r_{out1}$, i.e., the output impedance of the first stage. Specifically, the effective capacitance value of $C_{GD}$ ($C_{GD(EFFECT)}$) is determined by the following equation: $C_{GD(EFFECT)} = C_{GD} * gm1 * r_{out1}$. Therefore, the total capacitance value of $C_{P1}$ is determined by the equation: $C_{P1} = C_{GS} + C_{GD} * gm1 * r_{out1}$. One will note from this equation that for large values of gm1 (or $r_{out1}$), $C_{GD(EFFECT)}$ can become a significant component of $C_{P1}$. $C_{P1}$, in turn, may have a significant effect on the closed-loop bandwidth of an amplifier due to its inclusion in the equation for feedback attenuation, as explained above.

By connecting the sources and the drains of dummy transistors M1D and M2D (which are one-half the size of transistors M31 and M32), a capacitance is created between the gates and the source-drain connections of the devices that approximates the gate-to-drain capacitance of transistors M32 and M31, respectively. Since dummy transistors M1D and M2D are connected between outputs and inputs of opposite polarities, the capacitance across dummy transistor M1D serves to effectively cancel $C_{GD}$ of input transistor M32, and the capacitance across dummy transistor M2D serves to effectively cancel $C_{GD}$ of input transistor M31. This cancellation of the values of $C_{GD(EFFECT)}$ will significantly eliminate the adverse effect that these parasitic capacitances have on the closed-loop bandwidth due to feedback attenuation. An example of a CMOS layout for implementing the preceding circuit is fully disclosed in U.S. Pat. No. 5,767,542, which is incorporated herein by reference.

In addition to serving as a differential input pair for the second stage, transistors M35 and M36 also sense the common-mode level of the output of the first stage. That is, as the first stage outputs are applied to the gates of transistors M35 and M36, the common-mode component of these outputs is compared to the voltage applied to the gates of transistors M37 and M38, i.e., the voltage at bias node B1. This comparison divides the current from current source M44 into two portions: (1) a first portion that drives the differential pair of input transistors M35 and M36, and (2) a second portion the is pulled from (p-channel) current mirror M43 and (M33 and M34). Because changes in the amount of current being pulled from current mirror M43 and (M33 and M34) cause corresponding changes in the common-mode level of the first stage, this configuration results in the common-mode level of the first stage being regulated to equal the bias voltage present at bias node B1.

Circuit 62 also includes (n-channel) transistors M39 and M40 in series with the Miller capacitors 58B and 58A, respectively. The addition of transistors M39 and M40 causes a resistance to be inserted in the feedforward paths between the outputs of transistors M31 and M32 and the drains of cascode transistors M41 and M42, respectively. The addition of this resistance results in a feedforward zero being placed in the left-half of the S-plane of the circuit. By appropriately adjusting the aspect ratio (i.e., channel width/channel length) and properly biasing the gates of transistors M39 and M40, this feedforward zero may be placed at (or very close to) the location of the second pole of the two-stage amplifier (located at (approximately) gm2/$C_L$), resulting in a pole-zero cancellation in the S-plane. The optimization of this aspect ratio is discussed in conjunction with a description of biasing circuit 72 (shown in FIG. 7).

The cancellation of this pole means that the non-dominant component affecting the circuit's frequency response will become a parasitic pole of the amplifier, i.e., a pole caused by the parasitic capacitances of the amplifier's MOS transistors, which is at a very high frequency (e.g., approximately one GHz). This means that the bandwidth of the two-stage amplifier (BW$_{(TWO-STAGE)}$=gm1/$C_C$) may be increased significantly (by decreasing $C_C$ or by increasing gm1) without a corresponding degradation in gain and/or phase margin due to the (now canceled) second pole, i.e., the pole located at (approximately) gm2/$C_L$. Further, even if there is a slight mismatch between the locations of the feedforward zero and P2, the effect will be insignificant since P2 is beyond the closed loop-bandwidth of the circuit.

Finally, circuit 62 includes switch 74 connected between the gate (input) and drain (output) of first-stage input transistor M31, and switch 75 connected between the gate (input) and drain (output) of first-stage input transistor M32. The purpose and function of this switch is explained below.

Figure 7:
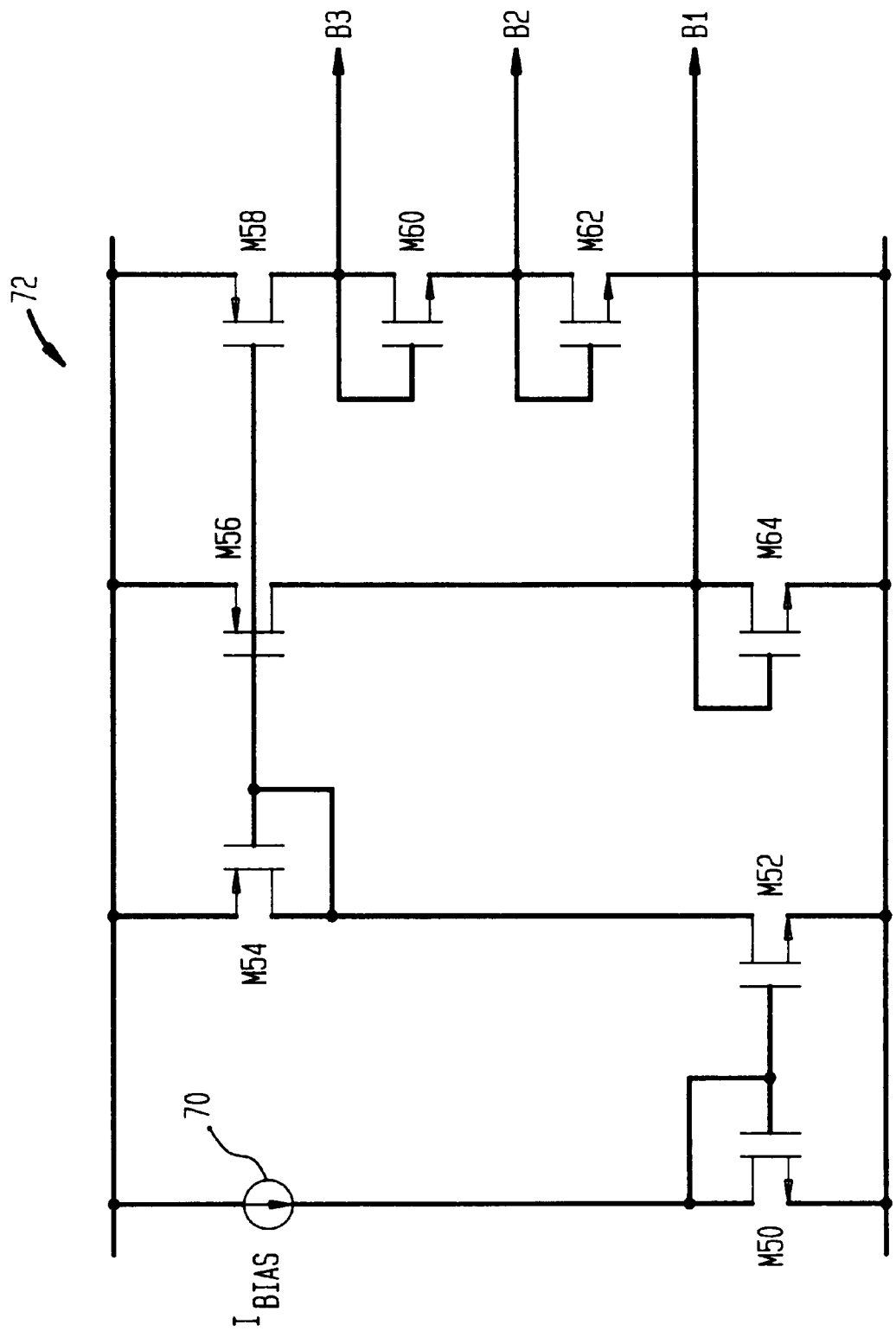
FIG. 7 is a schematic diagram of a circuit used to establish several bias voltages used by the invention.

Referring now to FIG. 7, a biasing circuit 72 is shown. This biasing circuit 72 is used to establish bias voltages at bias nodes B1, B2 and B3. As discussed previously, the common-mode level of the first stage is regulated to the voltage at bias node B1. This means that the source nodes of transistors M39 and M40 are kept at a common-mode level equal to the voltage at B1. In order to track properly the second pole (P2) located at (approximately) gm2/$C_L$ the voltage at bias nodes B3 tracks the voltage at bias node B1. In addition, the voltage at bias node B3 is created so as to account for process variations between transistors M39 and M40 and transistors M36 and M35, respectively. That is, the voltage at bias nodes B3 is created not only to track the voltage at bias node B1 (which accounts for the gate-to-source voltage ($V_{GS}$) of transistors M35 and M36), but also to track the device characteristics of transistors M39 and M40. Also, the voltage at bias nodes B2, which biases cascode transistors M41 and M42, tracks the voltage at bias node B1 (as well as the device characteristics of transistors M41 and M42) so as to bias cascode transistors M35 and M36 at the verge of saturation, thus maximizing the output signal-swing headroom available between output nodes OP and OM.

Biasing circuit 72 operates as follows. A bias current ($I_{BIAS}$) produced by current source 70 first is mirrored by (n-channel) current mirror M50 and M52, and then is passed on to two (p-channel) current mirrors, the first comprising (M54 and M56) and the second comprising (M54 and M58). Mirrored current from current mirror M54 and M56 passes through diode connected (n-channel) transistor M64 to produce a bias voltage at bias node B1. Similarly, mirrored current from current mirror M54 and M58 passes through diode connected (n-channel) transistors M60 and M62 to produce bias voltages at bias nodes B3 and B2.

In order to achieve an accurate pole-zero cancellation (i.e., a cancellation of the amplifier's second pole with the feedforward zero introduced by Miller transistors M39 and M40, as explained above) with the foregoing biasing circuit, the aspect ratio (A) of both of Miller transistors M39 and M40, i.e., $A_{(M39\ and\ M40)}$, should satisfy the following equation: $A_{(M39\ and\ M40)} = (C_C/(C_{12} * (1+C_L/C_C)+C_L+C_C)) *$ sqrt $(K * A_{(M35\ or\ M36)} * A_{M60})$, where $C_{I2}$ is the input capacitance of the second stage, K is the ratio of bias current $I_{BIAS}$ from current source 70 to the current from either of current sources 46 or 48, sqrt is the square root operator, and $A_{M35}$, $A_{M36}$, and $A_{M60}$ represent the aspect ratios of transistors M35. M36 and M60, respectively.

Switched-capacitor circuits (such as residue amplifiers in pipelined ADCs) often employ offset cancellation or auto-zero schemes to remove or reduce the effects of the offset voltage created at the input during amplification. Generally, the entire amplifier. i.e., both stages, is connected in a unity-gain configuration, thus forcing the voltage at the input nodes to the common-mode level of the output of the second stage, which is maintained at a (fixed) midpoint between the power supply rails. Instead, circuit 62 uses switches 74 and 75 (described above) to configure only the first stage in unity gain feedback to accomplish offset cancellation. In this manner, the voltage at the input nodes IM and IP is forced to the voltage at bias node B1 during offset cancellation, rather than to a fixed voltage. This is advantageous because it maximizes the headroom available in which to properly bias the input transistors M31 and M32 in the first stage.

The present invention thus provides a circuit having significant advantages over prior art single-stage and multi-stage Miller-compensated amplifiers. By using only n-channel (rather than p-channel) transistors in the entire feedforward signal path of a multi-stage amplifier, the deleterious effect of parasitic capacitances in the feedforward signal path is reduced, thereby increasing the circuit's bandwidth capability. The disclosed design also extends the circuit's bandwidth by canceling the effective gate-to-drain capacitance ($C_{GD}$) of the input transistors of the first stage and eliminating the circuit's second pole (P2) by introducing a feedforward zero in the S-plane of the circuit to cancel the effects of pole P2. Further, both stages are fully differential, which allows each stage to employ local common-mode feedback. This use of local common-mode feedback, in turn, significantly improves the common-mode response of the circuit. Also, by sensing the common-mode level of the first stage from a voltage at the common-source node of the second stage and producing a common-mode feedback current based on that voltage (rather than using a separate circuit to perform the same tasks), the common-mode control circuitry of the amplifier is simplified substantially.

It should be understood that the circuits described herein may be modified in various ways without departing from the spirit and scope of the invention. For example, the embodiments of the invention have been described as being differential in nature, while in most respects this is not a necessary limitation, as most aspects of the circuit also could be employed using a single-ended design. Also, the transistors in the signal path have been described as being exclusively n-channel transistors, but these devices also could be any transistors having common doping types (e.g., p-channel, NPN, or PNP transistors). Further, while particular systems and methods for generating a (local) common mode feedback signal, for locally controlling a common mode level of a circuit, and for generating a feedforward zero to cancel a pole of a circuit have been described, any similar systems or methods also could be used to achieve the same results without departing from the spirit and scope of the invention.

Having thus described at least one illustrative embodiment of the invention, various alterations, modifications and improvements will readily occur to those skilled in the art.

Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier circuit, comprising:
   a first amplifier stage having
      a first pair of input transistors having control electrodes arranged to receive an input signal and current electrodes coupled at a first common node,
      a pair of first outputs configured to emit a first output signal from the first amplifier stage, and
      at least one first current-source load coupled to at least one of the pair of first outputs, the current-source load generating a substantially constant amount of current regardless of changes in a voltage present at the at least one of the pair of first outputs;
   a second amplifier stage having
      a second pair of input transistors having current electrodes coupled at a second common node and each of the second pair of input transistors having a control electrode coupled to a respective one of the pair of first outputs to receive the first output signal from the first amplifier stage,
      at least one second output to emit a second output signal from the second amplifier stage, and
      at least one second current-source load coupled to the at least one second output, the current-source load generating a substantially constant amount of current regardless of changes in a voltage present at the at least one second output;
   wherein all transistors in a feedforward signal path extending between the control electrodes of the first pair of input transistors and the at least one second output are of a common doping type.

2. The amplifier circuit as claimed in claim 1, further comprising a first common-mode control network configured to control a common-mode level of the first amplifier stage based at least in part on the first output signal.

3. The amplifier circuit as claimed in claim 2, wherein the second amplifier stage includes a current-source coupled to the second common node.

4. The amplifier circuit as claimed in claim 2, further comprising, a second common-mode control network configured to control a common-mode level of the second amplifier stage based at least in part upon the second output signal.

5. The amplifier circuit as claimed in claim 1, further comprising a common-mode control network configured to control a common-mode level of the second amplifier stage based at least in part upon the second output signal.

6. The amplifier circuit as claimed in claim 5, wherein the second amplifier stage includes a current-source coupled to the second common node.

7. The amplifier circuit as claimed in claim 1, further comprising a common-mode control network configured to control a common-mode level of both the first and second amplifier stages based at least in part upon the second output signal.

8. The amplifier circuit as claimed in claim 1, wherein the first amplifier stage includes a first current-source coupled to the first common node.

9. The amplifier circuit as claimed in claim 8, wherein the second amplifier stage includes a second current-source coupled to the second common node.

10. The amplifier circuit as claimed in claim 1, wherein the second amplifier stage includes a current-source coupled to the second common node.

11. The amplifier circuit as claimed in claim 1, wherein:
   the first current-source load includes a first current-source transistor having a control electrode and first and second current electrodes, the first current electrode of the first current-source transistor being coupled to the at least one of the pair of first outputs, and the first current-source transistor being arranged such that a voltage presented between the control electrode and the second current electrode of the first current-source transistor is primarily responsible for determining an amount of current that flows between the first and second current electrodes of the first current-source transistor; and
   the second current-source load includes a second current-source transistor having a control electrode and first and second current electrodes the first current electrode of the second current-source transistor being coupled to the at least one second output, and the second current-source transistor being arranged such that a voltage presented between the control electrode and the second current electrode of the second current-source transistor is primarily responsible for determining an amount of current that flows between the first and second current electrodes of the second current-source transistor.

12. An amplifier circuit comprising:
   a first amplifier stage having
      at least one first input to receive an input signal,
      at least one first output to emit a first output signal, and
      at least one first current-source load coupled to the at least one first output, the at least one first current-source load generating a substantially constant amount of current regardless of changes in a voltage present at the at least one first output; and
   a second amplifier stage having
      at least one second input coupled to the at least one first output to receive the first output signal from the first amplifier stage, each output of the first amplifier stage being coupled to a respective input of the second amplifier stage,
      at least one second output to emit a second output signal, and
      at least one second current-source load coupled to the at least one second output, the at least one second current-source load generating a substantially constant amount of current regardless of changes in a voltage present at the at least one second output;
   wherein all transistors included in a feedforward signal path extending between the at least one first input and the at least one second output are of a common doping type.

13. The amplifier circuit as claimed in claim 12, further comprising a first common-mode control network configured to control a common-mode level of the first amplifier stage based at least in part on the first output signal.

14. The amplifier circuit as claimed in claim 13, further comprising a second common-mode control network configured to control a common-mode level of the second amplifier stage based at least in part upon the second output signal.

15. The amplifier circuit as claimed in claim 12, further comprising a common-mode control network configured to control a common-mode level of the second amplifier stage based at least in part upon the second output signal.

16. The amplifier circuit as claimed in claim 12, further comprising a common-mode control network configured to control a common-mode level of both the first and second amplifier stages based at least in part upon the second output signal.

17. The amplifier circuit as claimed in claim 12, wherein:

the first current-source load includes a first current-source transistor having a control electrode and first and second current electrodes, the first current electrode of the first current-source transistor being coupled to the at least one first output, and the first current-source transistor being arranged such that a voltage presented between the control electrode and the second current electrode of the first current-source transistor determines an amount of current that flows between the first and second current electrodes of the first current-source transistor; and the second current-source load includes a second current-source transistor having a control electrode and first and second current electrodes, the first current electrode of the second current-source transistor being coupled to the at least one second output and the second current-source transistor being arranged such that a voltage presented between the control electrode and the second current electrode of the second current-source transistor determines an amount of current that flows between the first and second current electrodes of the second current-source transistor.

18. The amplifier circuit as claimed in claim 12, wherein the first amplifier stage includes a first differential amplifier stage.

19. The amplifier circuit as claimed in claim 18, wherein the second amplifier stage includes a second differential amplifier stage.

20. The amplifier circuit as claimed in claim 12, wherein the second amplifier stage includes a differential amplifier stage.

* * * * *